(12) United States Patent
Park (10) Patent No.: US 8,809,991 B2
(45) Date of Patent: Aug. 19, 2014

(54) SEMICONDUCTOR DEVICES INCLUDING BIPOLAR TRANSISTORS, CMOS TRANSISTORS AND DMOS TRANSISTORS, AND METHODS OF MANUFACTURING THE SAME

(71) Applicant: SK hynix Inc., Icheon-si (KR)

(72) Inventor: Sung Kun Park, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/707,268

(22) Filed: Dec. 6, 2012

(65) Prior Publication Data
US 2013/0200453 A1    Aug. 8, 2013

(30) Foreign Application Priority Data
Feb. 3, 2012  (KR) .................. 10-2012-0011487

(51) Int. Cl.
*H01L 21/8232* (2006.01)
*H01L 27/088* (2006.01)

(52) U.S. Cl.
USPC .......................................... 257/501; 438/443

(58) Field of Classification Search
None
See application file for complete search history.

(56) References Cited

U.S. PATENT DOCUMENTS

| | | | |
|---|---|---|---|
| 8,013,416 B2* | 9/2011 | Yamanaka | 257/500 |
| 8,022,483 B2 | 9/2011 | Ko | |
| 8,394,695 B2* | 3/2013 | Yamanaka | 438/225 |
| 2002/0017697 A1* | 2/2002 | Kitamura et al. | 257/492 |
| 2003/0038316 A1* | 2/2003 | Tsuchiko et al. | 257/324 |
| 2006/0124999 A1* | 6/2006 | Pendharkar | 257/335 |
| 2006/0289947 A1* | 12/2006 | Yamanaka | 257/409 |
| 2009/0001461 A1* | 1/2009 | Ko | 257/343 |
| 2009/0325352 A1* | 12/2009 | Pendharkar | 438/286 |
| 2010/0051946 A1* | 3/2010 | Jun | 257/49 |
| 2010/0173458 A1* | 7/2010 | You et al. | 438/200 |
| 2011/0127602 A1 | 6/2011 | Mallikarjunaswamy | |

FOREIGN PATENT DOCUMENTS

| | | | |
|---|---|---|---|
| CN | 101771039 | * | 7/2010 |
| JP | 2010062564 A | * | 3/2010 |
| KR | 98044982 | * | 9/1998 |
| KR | 2006008042 | * | 1/2006 |
| KR | 1020100058055 A | | 6/2010 |
| KR | 1020100081628 A | | 7/2010 |
| KR | 101044388 B1 | | 6/2011 |
| KR | 1020110078885 A | | 7/2011 |

OTHER PUBLICATIONS

Hazel, Matthew. Semiconductor TCAD Fabrication Development for BCD Technology. Diss. Worcester Polytechnic Institute, 2006.*
Park, Il-Yong, et al., "BD180—a new 0.18 μm BCD (Bipolar-CMOS-DMOS) Technology from 7V to 60V", in Proc. Int. International Symposium on Power Semiconductor Devices and ICs, Orlando Fl, May 18-22, 2008, pp. 64-67.*

* cited by examiner

*Primary Examiner* — Thomas L Dickey
*Assistant Examiner* — Joseph Schoenholtz
(74) *Attorney, Agent, or Firm* — William Park & Associates Patent Ltd.

(57) ABSTRACT

Semiconductor devices having a bipolar transistor, a CMOS transistor, a drain extension MOS transistor and a double diffused MOS transistor are provided. The semiconductor device includes a semiconductor substrate including a logic region in which a logic device is formed and a high voltage region in which a high power device is formed, trenches in the semiconductor substrate, isolation layers in respective ones of the trenches, and at least one field insulation layer disposed at a surface of the semiconductor substrate in the high voltage region. Related methods are also provided.

14 Claims, 11 Drawing Sheets

SEMICONDUCTOR DEVICES INCLUDING BIPOLAR TRANSISTORS, CMOS TRANSISTORS AND DMOS TRANSISTORS, AND METHODS OF MANUFACTURING THE SAME

CROSS-REFERENCES TO RELATED APPLICATIONS

The present application claims priority under 35 U.S.C 119(a) to Korean Application No. 10-2012-0011487, filed on Feb. 3, 2012, in the Korean intellectual property Office, which is incorporated herein by reference in its entirety set forth in full.

BACKGROUND

1. Field of Invention

Various embodiments of the present disclosure generally relate to semiconductor devices and methods of manufacturing the same and, more particularly, to semiconductor devices including bipolar transistors, CMOS transistors and DMOS transistors, and methods of manufacturing the same.

2. Description of Related Art

A semiconductor device including bipolar transistors, complementary metal-oxide-semiconductor (CMOS) transistors and double diffused metal-oxide-semiconductor (DMOS) transistors may be referred to as a BCDMOS device. The BCDMOS device may have some advantages of high frequency and high voltage operation characteristics due to the bipolar transistors, low power consumption, and high integration density due to the CMOS transistors, and excellent power controllability due to a low on-resistance between a drain and a source of each DMOS transistor. That is, the BCDMOS device may include high power circuits with large driving currents and logic circuits with low power consumption. However, fabrication of the BCDMOS device may need complex process technologies and a large number of photo masks. Thus, manufacturing costs of the BCDMOS device may be increased. Therefore, various process technologies for forming the BCDMOS device may still be required to reduce the manufacturing costs and to improve performance thereof.

The BCDMOS devices have been continuously developed to meet the requirements for both the high integration density of the CMOS transistors constituting the logic circuits and the low on-resistance of the DMOS transistors constituting high voltage circuits. A relatively narrow and deep isolation layer may be required to increase the integration density of the logic circuits. In contrast, a relatively gentle and shallow field oxide layer on which a field plate is located may be required to reduce the on-resistance of the DMOS transistors, for example, lateral double diffused metal-oxide-semiconductor (LDMOS) transistors. The logic circuits employed in the conventional power management integrated circuits (PMICs) may have a relatively simple configuration. Thus, process developments of the conventional PMICs have focused on the LDMOS transistors rather than the CMOS transistors. That is, the conventional BCDMOS devices have been developed to reduce the on-resistance of the LDMOS transistors. For example, shallow trenches with a relatively gentle sloped sidewall have been widely used to increase the on-resistance of the LDMOS transistors.

As functions of the PMICs become more complicated, areas that the logic circuits occupy have been gradually increased. Thus, when the aforementioned isolation technologies are applied to fabrication of the CMOS transistors used in realization of the logic circuits, the chip sizes of the BCDMOS devices including the logic circuits may increase. Accordingly, new process technologies, which are commonly applicable to both the CMOS transistors and the LDMOS transistors, may be required to improve both the integration density of the CMOS transistors and the on-resistance of the LDMOS transistors.

SUMMARY

Various embodiments are directed to semiconductor devices including bipolar transistors, CMOS transistors and LDMOS transistors.

Further, various embodiments are directed to methods of manufacturing semiconductor devices including bipolar transistors, CMOS transistors, and LDMOS transistors.

According to various embodiments, a semiconductor device includes a semiconductor substrate including a logic region in which a logic device is formed and a high voltage region in which a high power device is formed, trenches in the semiconductor substrate, isolation layers in respective ones of the trenches, and at least one field insulation layer disposed at a surface of the semiconductor substrate in the high voltage region. The at least one field insulation layer is a local oxidation of silicon (LOCOS) layer that includes a first portion extending into the semiconductor substrate and a second portion upwardly protruding from a top surface of the semiconductor substrate.

In various embodiments, the first portion of the field insulation layer may have a first thickness corresponding to about 40% of a total thickness of the field insulation layer, and the second portion of the field insulation layer may have a second thickness corresponding to about 60% of the total thickness of the field insulation layer.

In various embodiments, each of the isolation layers may include a high density plasma (HDP) oxide layer, a spin-on-glass (SOG) layer or a tetra-ethyl-ortho-silicate (TEOS) layer.

In various embodiments, the logic device may include CMOS transistors and a bipolar transistor, and the high power device may include a drain extension MOS (DEMOS) transistor and a double diffused MOS (DMOS) transistor.

In various embodiments, the at least one field insulation layer may be disposed at a surface of a drift region of a first conductivity type formed in the semiconductor substrate. The DMOS transistor may include a body region of a second conductivity type disposed in the semiconductor substrate to be spaced apart from the drift region, a source of the first conductivity type disposed in the body region, a drain of the first conductivity type disposed in the drift region to be adjacent to an end of the field insulation layer, and a gate pattern disposed to overlap with the body region and to extend onto the first field insulation layer.

In various embodiments, the at least one field insulation layer may be disposed at a surface of a first well of a first conductivity type formed in the semiconductor substrate. The DEMOS transistor may include a second well of a second conductivity type disposed in the semiconductor substrate to surround sidewalls of the first well, a gate pattern disposed to overlap with the second well and to extend onto the field insulation layer, a source disposed in the second well to be adjacent to an end of the gate pattern, and a drain disposed in the first well to be adjacent to an end of the field insulation layer opposite to the source.

According to further embodiments, a method of manufacturing a semiconductor device includes forming a trench isolation mask on a semiconductor substrate including a logic region in which a logic device is formed and a high voltage region in which a high power device is formed, forming trench isolation layers in the semiconductor substrate exposed by the trench isolation mask, patterning the trench isolation mask to form a field mask pattern exposing at least one portion of the semiconductor substrate, annealing and oxidizing the substrate including the field mask pattern to densify the isolation layers and to form at least one field insulation layer of the high power device at a surface of the exposed semiconductor substrate, removing the field mask pattern, forming first wells of a first conductivity type and second wells of a second conductivity type in the semiconductor substrate, and forming gate patterns of the logic device and the high power device on the substrate including the first wells and the second wells.

In various embodiments, forming the trench isolation mask may include forming a pad oxide layer on the semiconductor substrate, forming a nitride layer on the pad oxide layer, and patterning the nitride layer and the pad oxide layer to expose portions of the semiconductor substrate.

In various embodiments, forming the trench isolation layers may include etching the semiconductor substrate using the trench isolation mask as an etch mask to form trenches, forming an insulation layer on the trench isolation mask and in the trenches, and planarizing the insulation layer.

In various embodiments, the insulation layer may be planarized using a chemical mechanical polishing (CMP) process, and the trench isolation mask may remain to have a thickness of about 700 Å to about 800 Å after planarization of the insulation layer.

In some embodiments, annealing and oxidizing the substrate may be performed in an ambient gas including an oxygen gas and a nitrogen gas.

In various embodiments, annealing and oxidizing the substrate may include annealing the substrate in a nitrogen gas, and oxidizing the annealed substrate in an oxygen gas.

According to further embodiments, a method of manufacturing a semiconductor device includes providing a semiconductor substrate of a first conductivity type having a bipolar transistor region, a CMOS transistor region, a drain extension MOS transistor region and a double diffused MOS transistor region, forming a drift region of a second conductivity type and a body region of the first conductivity type spaced apart from each other in the semiconductor substrate of the double diffused MOS transistor region, forming a trench isolation mask on the substrate including the drift region and the body region, forming trench isolation layers in portion of the semiconductor substrate exposed by the trench isolation mask, patterning the trench isolation mask to form a field mask pattern exposing a portion of the drift region, annealing and oxidizing the substrate including the field mask pattern to densify the trench isolation layers and to form a field insulation layer at a surface of the exposed drift region, removing the field mask pattern, forming first wells of the first conductivity type and second wells of the second conductivity type in the semiconductor substrate, and forming gate patterns on the substrate including the first wells and the second wells.

In various embodiments, the method may further include forming a semiconductor layer of the first conductivity type on the semiconductor substrate prior to formation of the drift region and the body region, forming a deep well of the second conductivity type located at a predetermined depth from a top surface of the semiconductor layer, and forming a first high voltage well of the first conductivity type and a second high voltage well of the second conductivity type in the semiconductor layer of the drain extension MOS transistor region.

The drift region and the body region may be formed in the semiconductor layer of the double diffused MOS transistor region.

In various embodiments, the semiconductor layer of the first conductivity type may be formed of an epitaxial layer.

In various embodiments, forming the trench isolation layers may include etching the semiconductor substrate using the trench isolation mask as an etch mask to form trenches, forming an insulation layer on the trench isolation mask and in the trenches, and planarizing the insulation layer.

In various embodiments, the insulation layer may be planarized using a chemical mechanical polishing (CMP) process, and the trench isolation mask may remain to have a thickness of about 700 Å to about 800 Å after planarization of the insulation layer.

In some embodiments, annealing and oxidizing the substrate may be performed in an ambient gas including an oxygen gas and a nitrogen gas.

In various embodiments, annealing and oxidizing the substrate may include annealing the substrate including the field mask pattern in a nitrogen gas and oxidizing the annealed substrate in an oxygen gas.

In various embodiments, forming the drift region and the body region may be preceded by forming buried layers of the second conductivity type on the semiconductor substrate in the bipolar transistor region and in the double diffused MOS transistor region and forming a semiconductor layer of the first conductivity type on the buried layers and the semiconductor substrate. The drift region and the body region may be formed in the semiconductor layer.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Various embodiments are described more fully hereinafter with reference to the accompanying drawings. In explanations of the various embodiments, the same or corresponding elements may be denoted by the same reference numerals or the same reference designators.

Figure 1:
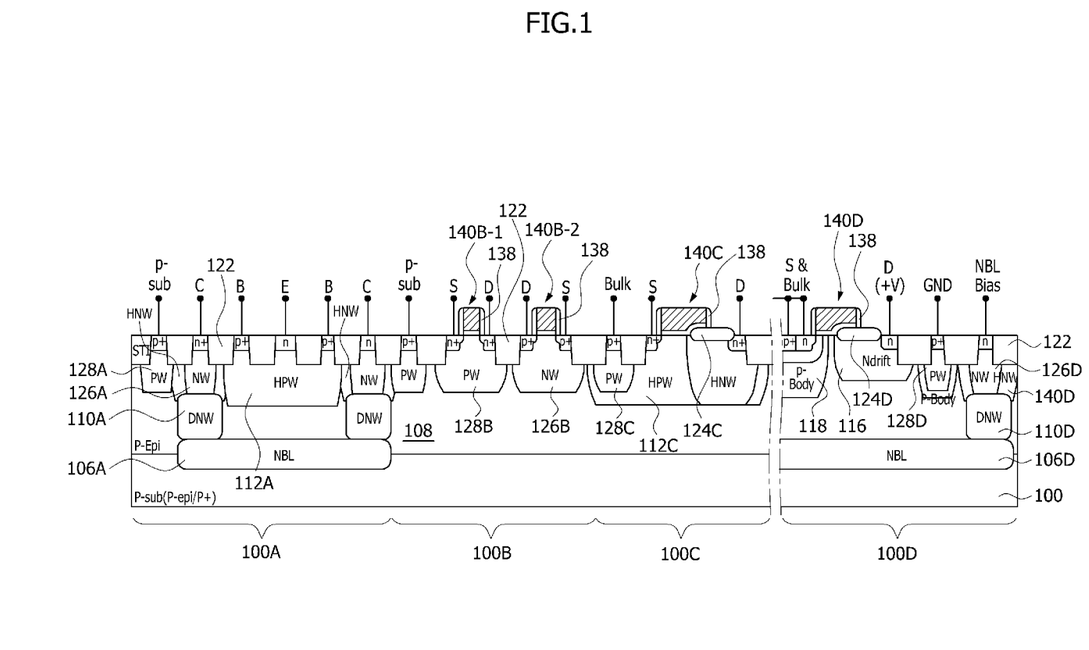
FIG. 1 is a cross sectional view illustrating a BCDMOS device according to various embodiments.

FIG. 1 is a cross sectional view illustrating a BCDMOS device according to various embodiments.

Referring to FIG. 1, the BCDMOS device according to various embodiments may include a bipolar transistor region 100A, a CMOS transistor region 100B, a drain extended N-channel MOS (DENMOS) transistor region 100C, and a lateral double diffused N-channel MOS (LDNMOS) transistor region 100D.

An n-p-n bipolar transistor may be disposed in the bipolar transistor region 100A. The n-p-n bipolar transistor may be configured to include a p-type base B, an n-type emitter E, and an n-type collector C which are separated from each other by a trench isolation layer 122.

An NMOS transistor and a PMOS transistor may be disposed in the CMOS transistor region 100B. The NMOS transistor may include an n-type source S and an n-type drain D spaced apart from each other and formed in a p-type well (PW) 128B, and a gate 140B-1 disposed on the p-type well 128B between the n-type source (n+) S and the n-type drain (n+) D. The PMOS transistor may include a p-type source (p+) S and a p-type drain (p+) D spaced apart from each other and formed in an n-type well (NW) 126B, and a gate 140B-2 disposed on the n-type well 126B between the p-type source S and the p-type drain D. The NMOS transistor and the PMOS transistor may be disposed to be symmetrical to a line between the NMOS transistor and the PMOS transistor, when viewed from a cross sectional view of FIG. 1.

A drain extended NMOS transistor may be disposed in the DENMOS transistor region 100C. The drain extended NMOS transistor may include a trench isolation layer 122 defining an active region, a field insulation layer 124C disposed in and on a portion of the active region, a gate 140C covering a portion of the active region and extending onto the field insulation layer 124C, a source S (n+) disposed in the active region to be adjacent to an end of the gate 140C, and a drain D (n+) disposed to be adjacent to an end of the field insulation layer 124C opposite to the gate 140C.

An LDNMOS transistor may be disposed in the LDNMOS transistor region 100D. The LDNMOS transistor may include the trench isolation layer 122 defining an active region in the LDNMOS transistor region 100D, an n-type drift region 116 disposed in a semiconductor substrate 100, a p-type body region 118 spaced apart from the n-type drift region 116, an n-type source S disposed in the p-type body region 118, an n-type drain D disposed in the n-type drift region 116, a field insulation layer 124D disposed in and on a portion of the n-type drift region 116 to be adjacent to the n-type drain D, and a gate 140D covering the active region between the n-type source S and drain D and extending onto the field insulation layer 124D.

The field insulation layer 124C in the DENMOS transistor region 100C and the field insulation layer 124D in the LDNMOS transistor region 100D may be formed using a local oxidation of silicon (LOCOS) process. In such a case, a first portion (about 40 vol. %) of each of the field insulation layers 124C and 124D may be formed in the substrate 100, and a second portion (about 60 vol. %) of each of the field insulation layers 124C and 124D may be formed to protrude from an initial top surface of the substrate 100. That is, the first portion of the field insulation layer 124C (or 124D) may be formed to have a thickness which corresponds to about 40% of a total thickness of the field insulation layer 124C (or 124D), and the second portion of the field insulation layer 124C (or 124D) may be formed to have a thickness which corresponds to about 60% of the total thickness of the field insulation layer 124C (or 124D).

The trench isolation layers 122 may be disposed to electrically isolate the active regions from each other. In the various embodiments, the trench isolation layers 122 may be disposed to increase the integration density of logic circuits formed in the CMOS transistor region 100B. The trench isolation layers 122 may include an insulation layer which is widely used in fabrication of semiconductor devices. For example, the trench isolation layers 122 may include a high density plasma (HDP) oxide layer, a spin-on-glass (SOG) layer, or a tetra-ethyl-ortho-silicate (TEOS) layer.

As described above, the BCDMOS devices may include the trench isolation layers 122 used as device isolation layers and the LOCOS field insulation layers 124C and 124D used as field insulation layers of high power devices. The trench isolation layers 122 may be formed to be deep and narrow. Thus, the trench isolation layers 122 may exhibit an excellent isolation characteristic and may increase the integration density of the logic circuits formed in and on the substrate 100, particularly, in the CMOS transistor region 100B.

Further, the field insulation layers 124C and 124D disposed in the high power device regions such as the DENMOS transistor region 100C and the LDNMOS transistor region 100D may be formed using a LOCOS process, as described above. In such a case, each of the field insulation layers 124C and 124D may be formed to include a first portion that is disposed in the substrate 100 to have a first thickness corresponding to about 40% of a total thickness thereof and a second portion that is disposed on the substrate 100 to have a second thickness corresponding to about 60% of the total thickness thereof. In high power devices such as the LDMOS transistors, a high voltage of about 30 volts to about 60 volts may be applied to the high power devices. Accordingly, the thickness of the field insulation layers 124C and 124D should be sufficient to endure the high voltage of about 30 volts to about 60 volts without any dielectric breakdown phenomena. According to the various embodiments, even though the field insulation layers 124C and 124D may be formed to have an enough thickness to endure the high voltage without any dielectric breakdown, only an about 40% portion of each of the field insulation layers 124C and 124D may be grown into the substrate 100. Further, a lower edge of each of the field insulation layers 124C and 124D may have a rounded shape due to a bird's beak because the field insulation layers 124C and 124D may be formed using a LOCOS process. Thus, a lateral current path in the n-type drift region 116 under the field insulation layer 124D may have a relatively large cross sectional area and a relatively short length. As a result, an on-resistance of the high power device such as the LDNMOS transistor may be minimized.

In addition, the field insulation layers 124C and 124D may be formed using a thermal oxidation process. Thus, the field insulation layers 124C and 124D may have a uniform thickness, and a trap density in the field insulation layers 124C and 124D may be minimized. As a result, the high power devices may exhibit stable electrical characteristics and/or an excellent reliability relating to hot carrier injection (HCI), and pre-cleaning processes can be stably performed in subsequent process steps.

FIGS. 2-6, 7A-7B, and 8-10 are cross sectional views illustrating a method of manufacturing a BCDMOS device according to various embodiments. The various embodiments may be modified such that the elements illustrated herein include their complementary counterparts. However, for the purpose of ease and convenience in explanation, the following embodiments will be described hereinafter in conjunction with any one of a p-type device and an n-type device.

Figure 2:
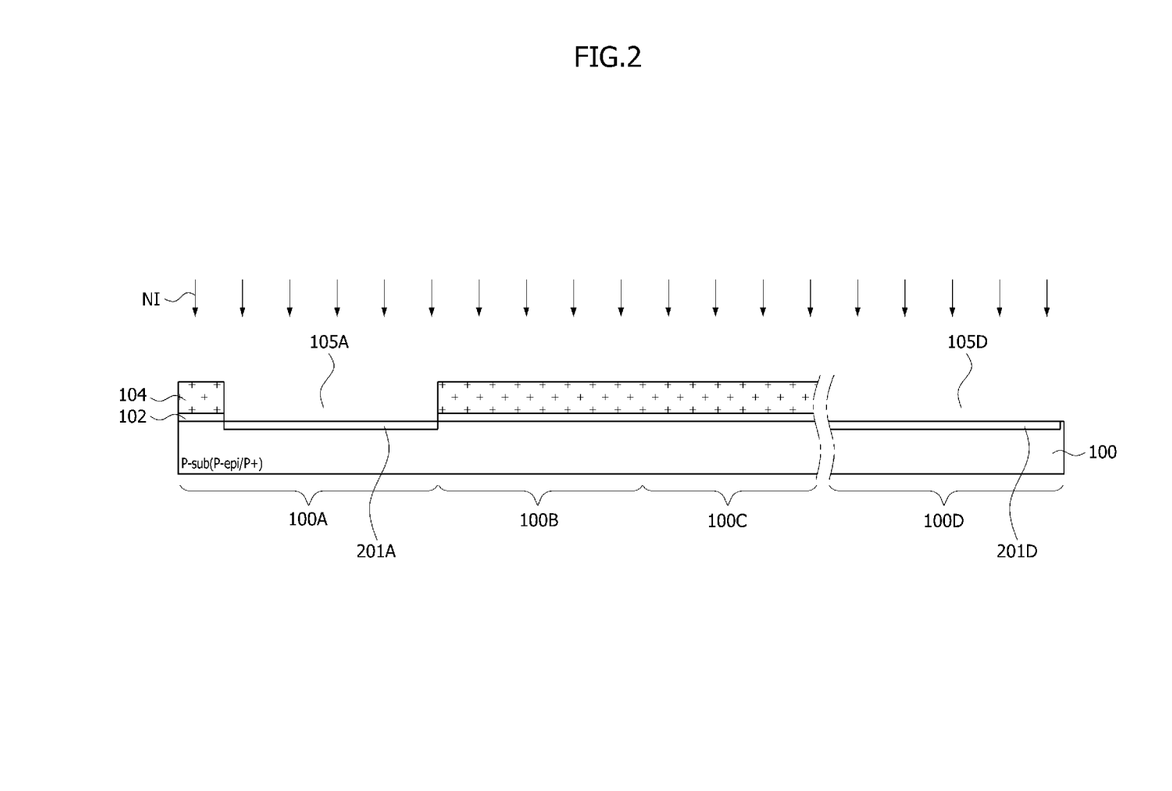
FIGS. 2-6, 7A-7B, and 8-10 are cross sectional views illustrating a method of manufacturing a BCDMOS device according to various embodiments.

Referring to FIG. 2, a semiconductor substrate 100 of a first conductivity type, for example, a p-type semiconductor substrate may be provided. The semiconductor substrate 100 may include a bipolar transistor region 100A, a CMOS transistor region 100B, a drain extended N-channel MOS (DENMOS) transistor region 100C and a lateral double diffused N-channel MOS (LDNMOS) transistor region 100D. An n-p-n bipolar transistor may be formed in the bipolar transistor region 100A, and a CMOS circuit including an NMOS transistor and a PMOS transistor may be formed in the CMOS transistor region 100B. Further, a drain extended N-channel MOS (DENMOS) transistor may be formed in the DENMOS transistor region 100C, and a lateral double diffused N-channel MOS (LDNMOS) transistor may be formed in the LDNMOS transistor region 100D.

Subsequently, an oxide pattern 102 and a photoresist pattern 104 may be formed on the semiconductor substrate 100. Specifically, an oxide layer and a photoresist layer may be sequentially formed on the semiconductor substrate 100. The photoresist layer may be exposed and developed using a photolithography process, thereby forming the photoresist pattern 104. The photoresist pattern 104 may be used as an etch mask and/or an ion implantation mask in subsequent processes. The oxide layer may be then etched using the photoresist pattern 104 as an etch mask, thereby forming the oxide pattern 102. As a result, the oxide pattern 102 and the photoresist pattern 104 may be formed to have openings 105A and 105D that expose some portions of the semiconductor substrate 100. That is, the opening 105A may be formed in the bipolar transistor region 100A, and the opening 105D may be formed in the LDNMOS transistor region 100D.

N-type impurity ions NI may be injected into the semiconductor substrate 100 using the photoresist pattern 104 as an implantation mask, thereby forming n-type impurity regions 201A and 201D. The n-type impurity regions 201A and 201D may be formed in the bipolar transistor region 100A and the LDNMOS transistor region 100D, respectively. The n-type impurity ions NI may include arsenic ions. In various other embodiments, the n-type impurity regions 201A and 201D may be formed using the photoresist pattern 104 as an implantation mask before the oxide layer is etched.

Figure 3:
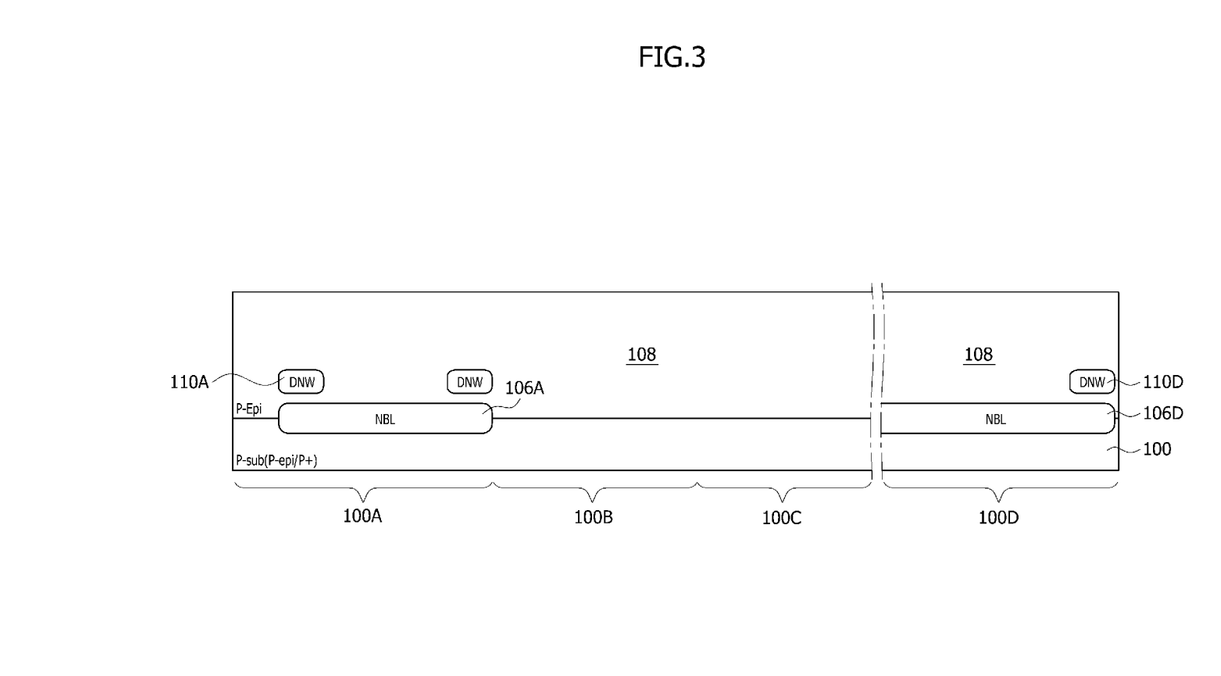

Referring to FIG. 3, the photoresist pattern 104 may be removed, and a diffusion process may be applied to the substrate where the photoresist pattern 104 is removed. As a result, the n-type impurity ions NI in the n-type impurity regions 201A and 201D may be diffused to form n-type buried layers (NBL) 106A and 106D in respective ones of the bipolar transistor region 100A and the LDNMOS transistor region 100D.

Subsequently, the oxide layer or the oxide pattern 102 may be removed to expose the semiconductor substrate 100 and the n-type buried layers 106A and 106D. A p-type epitaxial layer 108 may be then grown on the exposed semiconductor substrate 100 and the exposed n-type buried layers 106A and 106D. Deep n-wells (DNW) 110A and 110D may be formed in the p-type epitaxial layer 108. That is, the deep n-wells 110A and 110D may be formed at a certain depth from a top surface of the p-type epitaxial layer 108. The deep n-wells 110A and 110D may be formed using a similar manner to the method of forming the n-type buried layers 106A and 106D. That is, an oxide layer and a photoresist layer may be sequentially formed on the p-type epitaxial layer 108, and the photoresist layer may be patterned to form photoresist pattern having openings that expose some portions of the oxide layer. N-type impurity ions may be then injected into the p-type epitaxial layer 108 using the photoresist pattern as an ion implantation mask, thereby forming the deep n-wells 110A and 110D. The photoresist pattern and the oxide layer may be removed after formation of the deep n-wells 110A and 110D. The deep n-wells 110A and 110D may be formed over the n-type buried layers 106A and 106D, respectively. In particular, the deep n-wells 110A may be formed to cover an edge of the n-type buried layer 106A when viewed from a plan view.

Figure 4:
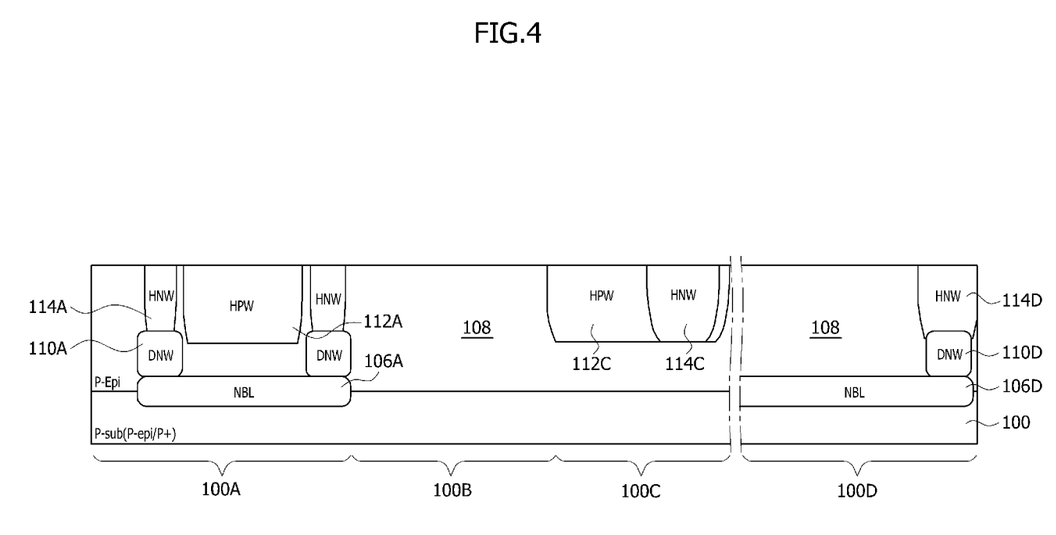

Referring to FIG. 4, high voltage p-wells 112A and 112C and high voltage n-wells 114A, 114C and 114D may be formed in the p-type epitaxial layer 108. Additionally, a first oxide layer and a first photoresist layer may be sequentially formed on the p-type epitaxial layer 108, and the first photoresist layer may be patterned to form a first photoresist pattern. Further, the first oxide layer may be etched using the first photoresist pattern as an etch mask, thereby forming a first oxide pattern. In an embodiment, the etching step for forming the first oxide pattern may be omitted. The first photoresist pattern may be formed to have openings which are located in the bipolar transistor region 100A and the DENMOS transistor region 100C. N-type impurity ions, for example, phosphorus ions may be injected into the p-type epitaxial layer 108 using the first photoresist pattern as an ion implantation mask, and the first photoresist pattern and the first oxide pattern (or the first oxide layer) may be then removed. A second oxide layer and a second photoresist layer may be sequentially formed on the p-type epitaxial layer 108, and the second photoresist layer may be patterned to form a second photoresist pattern. Further, the second oxide layer may be etched using the second photoresist pattern as an etch mask, thereby forming a second oxide pattern. In an embodiment, the etching step for forming the second oxide pattern may be omitted. The second photoresist pattern may be formed to have openings which are located in the bipolar transistor region 100A, the DENMOS transistor region 100C and the LDNMOS transistor region 100D. P-type impurity ions, for example, boron ions may be injected into the p-type epitaxial layer 108 using the second photoresist pattern as an ion implantation mask.

Subsequently, the second photoresist pattern may be then removed, and a diffusion process may be applied to the substrate where the second photoresist pattern is removed. As a result, the n-type impurity ions and the p-type impurity ions in the p-type epitaxial layer 108 may be diffused to form the high voltage p-wells 112A and 112C and the high voltage n-wells 114A, 114C and 114D. The high voltage p-well 112A may be formed over a central portion of the n-type buried layer 106A in the bipolar transistor region 100A, and the high voltage p-well 112C may be formed in the DENMOS transistor region 100C. Further, the high voltage n-well 114A may be formed to surround sidewalls of the high voltage p-well 112A, and the high voltage n-well 114C may be formed to contact a sidewall of the high voltage p-well 112C. In addition, during the diffusion process for forming the high voltage p-wells 112A and 112C and the high voltage n-wells 114A, 114C and 114D, the deep n-wells 110A and 110D may be formed to contact the edges of the n-type buried layers 106A and 106D, respectively, and the high voltage n-wells 114A and 114D may be formed to contact top surfaces of the deep n-wells 110A and 110D, respectively.

Figure 5:
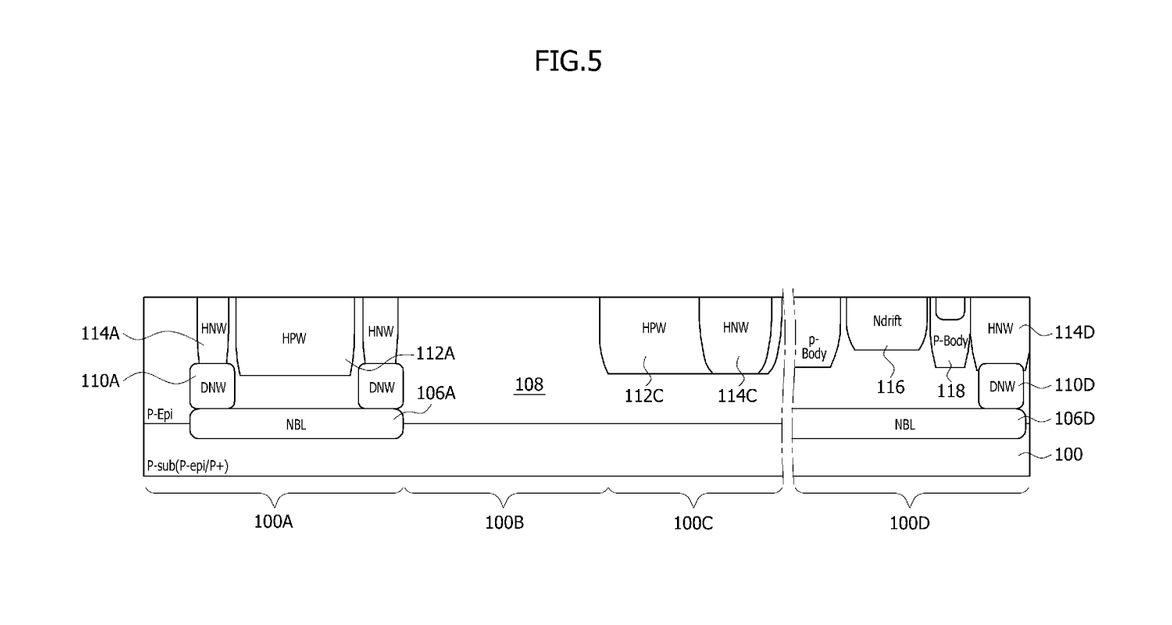

Referring to FIG. 5, an n-type drift region 116 and a p-type body region 118 may be formed in the LDNMOS transistor region 100D. Additionally, a first ion implantation mask may be formed on the p-type epitaxial layer 108, and n-type impurity ions such as phosphorus ions may be injected into the p-type epitaxial layer 108 using the first ion implantation mask to form the n-type drift region 116 in the LDNMOS transistor region 100D. After formation of the n-type drift region 116, the first ion implantation mask may be removed and a second implantation mask may be formed on the p-type epitaxial layer 108. P-type impurity ions such as boron ions may be injected into the p-type epitaxial layer 108 using the second ion implantation mask to form the p-type body region 118 adjacent to the n-type drift region 116. The first and second ion implantation masks may be formed of a photoresist layer.

Figure 6:
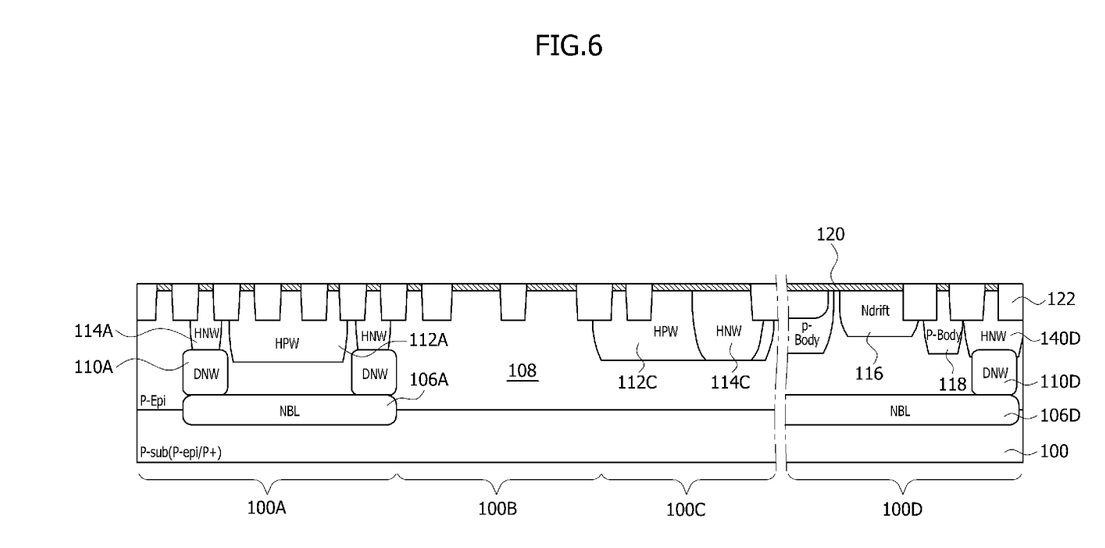

Referring to FIG. 6, an isolation mask pattern may be formed on the substrate including the p-type body region 118. Forming the isolation mask pattern may include sequentially stacking a pad oxide layer and a nitride layer 120 on the substrate including the p-type body region 118 and etching the nitride layer 120 and the pad oxide layer to expose portions of the substrate including the p-type body region 118.

The exposed substrate may be then etched using the patterned nitride layer 120 as an etch mask, thereby forming trenches having a certain depth. The trenches may be formed in the bipolar transistor region 100A, the CMOS transistor region 100B, the DENMOS transistor region 100C and the LDNMOS transistor region 100D.

An insulation layer may be formed in the trenches and on the substrate outside the trenches. The insulation layer for substantially filling the trenches may be formed of a high density plasma (HDP) oxide layer, a spin-on-glass (SOG) layer or a tetra-ethyl-ortho-silicate (TEOS) layer. The insulation layer may be planarized to form isolation layers 122 in the trenches. The planarization process for forming the isolation layers 122 may be performed using a chemical mechanical polishing (CMP) process. The CMP process may be performed until the patterned nitride layer 120 (e.g., a nitride pattern) constituting the isolation mask pattern is exposed. During the CMP process, the patterned nitride layer 120 of the isolation mask pattern may be etched by a certain thickness. Thus, the CMP process may be controlled and performed such that the remaining nitride pattern 120 has a thickness of about 700 angstroms (Å) to about 800 Å. The remaining nitride pattern 120 may be used as an oxidation resistant mask in a subsequent process for forming filed insulation layers of LDNMOS transistors.

Figure 7A:
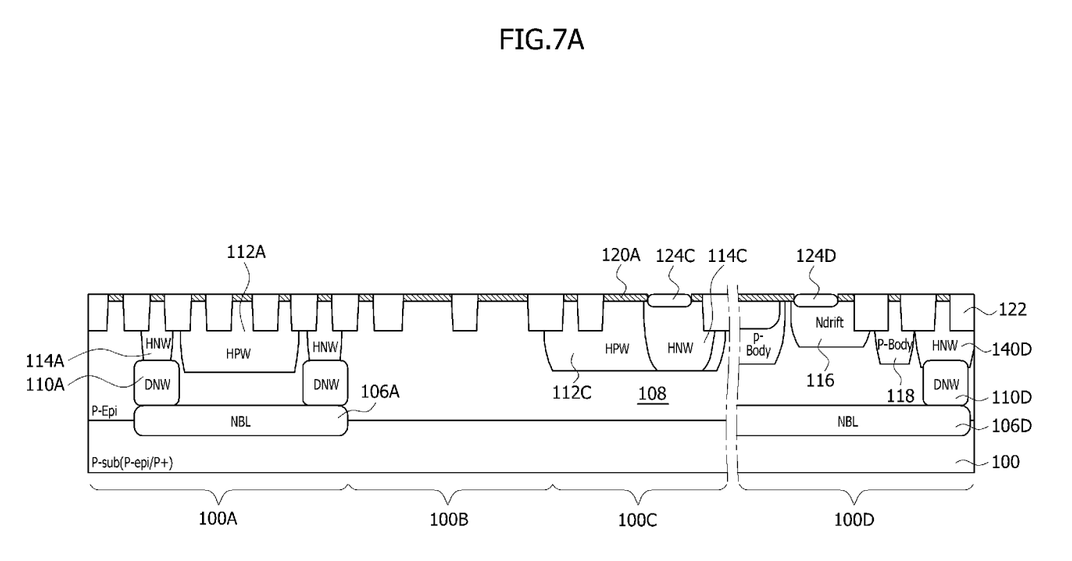

Referring to FIG. 7A, the remaining nitride pattern 120 may be patterned using a photolithography process, thereby forming a field mask pattern 120A. The field mask pattern 120A may be formed to expose a portion of the n-type drift region 116 in the LDNMOS transistor region 100D and a portion of the high voltage n-well 114C in the DENMOS transistor region 100C. Subsequently, the substrate including the field mask pattern may be annealed to densify the isolation layers 122 in the trenches. The annealing process for densifying the isolation layers 122 may be performed at a temperature of about 800° C. to about 1000° C. in an ambient gas including a nitrogen gas and an oxygen gas for about 30 minutes to about 90 minutes.

During the annealing process, the isolation layers 122 such as an HDP oxide layer may be densified. Further, during the annealing process, the n-type drift region 116 and the high voltage n-well 114C exposed by the field mask pattern 120A may be selectively oxidized to form a field insulation layer 124C on the high voltage n-well 114C and a field insulation layer 124D on the n-type drift region 116. The field insulation layers 124C and 124D may be formed to a thickness of about 800 Å to about 1500 Å. As described above, the densification of the trench isolation layers 122 and the formation of the field insulation layers 124C and 124D may be simultaneously achieved using an ambient gas including a nitrogen gas and an oxygen gas. However, the inventive concepts are not limited thereto. In various embodiments, the densification of the trench isolation layers 122 and the formation of the field insulation layers 124C and 124D may be achieved using two separated annealing processes. That is, the trench isolation layers 122 may be densified using a first annealing process that is performed in an ambient gas including a nitrogen gas, and the field insulation layers 124C and 124D may be formed using a second annealing process that is performed in an ambient gas including an oxygen gas.

Figure 7B:
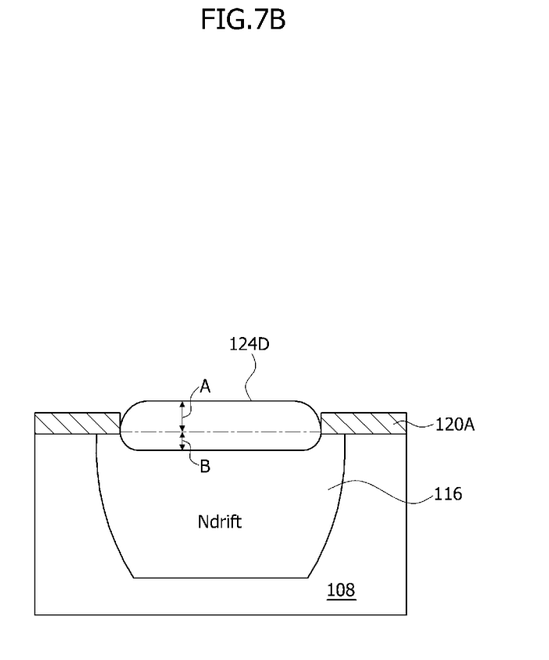

As described above, the field mask pattern 120A may be formed by additionally patterning the nitride pattern 120 used in formation of the trenches. Thus, the process for forming the field mask pattern 120A may be simplified. Further, the field insulation layers 124C and 124D in the DENMOS transistor region 100C and the LDNMOS transistor region 100D to which high voltages are applied may be formed using a LOCOS process. Thus, each of the field insulation layers 124C and 124D may include a first portion that is formed in the high voltage n-well 114C (or the n-type drift region 116) to have a first thickness B corresponding to about 40% of a total thickness thereof and a second portion that is formed to upwardly protrude from a top surface of the high voltage n-well 114C (or the n-type drift region 116) and to have a second thickness A corresponding to about 60% of the total thickness thereof, as illustrated in FIG. 7B. This is due to the nature of the LOCOS process. Accordingly, since only a portion of each of the field insulation layers 124C and 124D is formed to extend into the n-type drift region 116 (or the high voltage n-well 114C, a lateral current path in the n-type drift region 116 under the field insulation layer 124D may have a relatively large cross sectional area and a relatively short length. In addition, a lower edge of each of the field insulation layers 124C and 124D may have a rounded shape due to a bird's beak because the field insulation layers 124C and 124D may be formed using a LOCOS process. As a result, an on-resistance of the high power device such as the LDNMOS transistor or the DENMOS transistor may be minimized.

Moreover, the field insulation layers 124C and 124D may be formed using a thermal oxidation process. Thus, the field insulation layers 124C and 124D may have a uniform thickness, and a trap density in the field insulation layers 124C and 124D may be minimized. As a result, the high power devices may exhibit stable electrical characteristics and/or an excellent reliability relating to hot carrier injection (HCI), and pre-cleaning processes can be stably performed in subsequent process steps.

Figure 8:
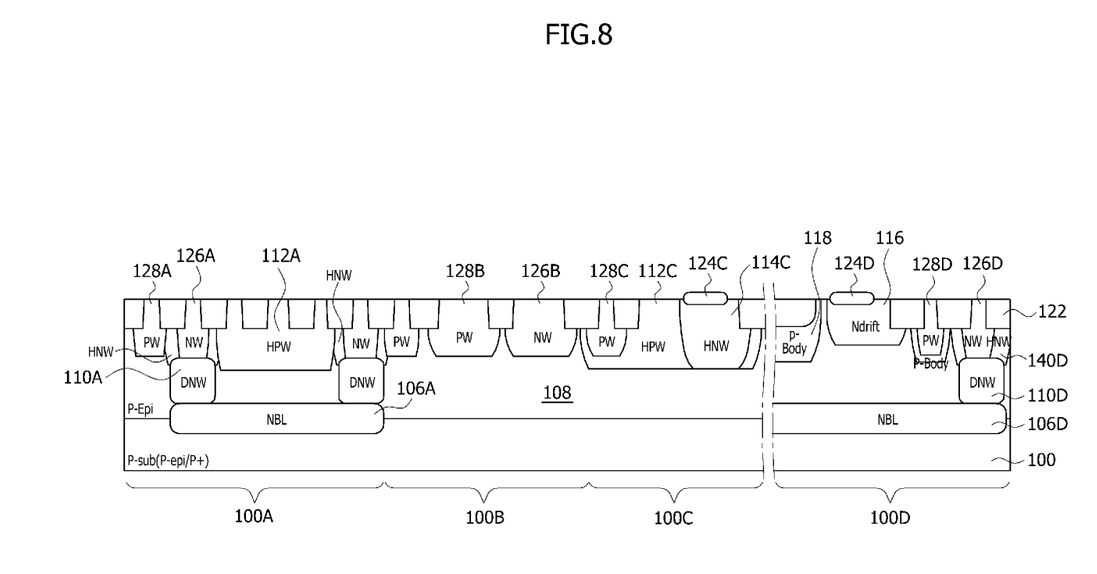

Referring to FIG. 8, the field mask pattern 120A may be removed after formation of the field insulation layers 124C and 124D. Subsequently, n-wells (NW) 126A, 126B, and 126D and p-wells (PW) 128A, 128B, 128C, and 128D may be formed in the substrate (e.g., the p-type epitaxial layer 108). The n-wells 126A, 126B, and 126D and the p-wells 128A, 128B, 128C, and 128D may also be formed using ion implantation processes. The n-wells 126A, 126B, and 126D may be formed in the bipolar transistor region 100A, the CMOS transistor region 100B and the LDNMOS transistor region 100D, respectively. The p-wells 128A, 128B, 128C, and 128D may be formed in the bipolar transistor region 100A, the CMOS transistor region 100B, the DENMOS transistor region 100C, and the LDNMOS transistor region 100D, respectively. The n-well 126A may be formed to reduce a series resistance of a collector of an n-p-n bipolar transistor, and the n-well 126B may be formed to provide a bulk region of a PMOS transistor. The p-well 128B may be formed to provide a bulk region of an NMOS transistor.

Figure 9:
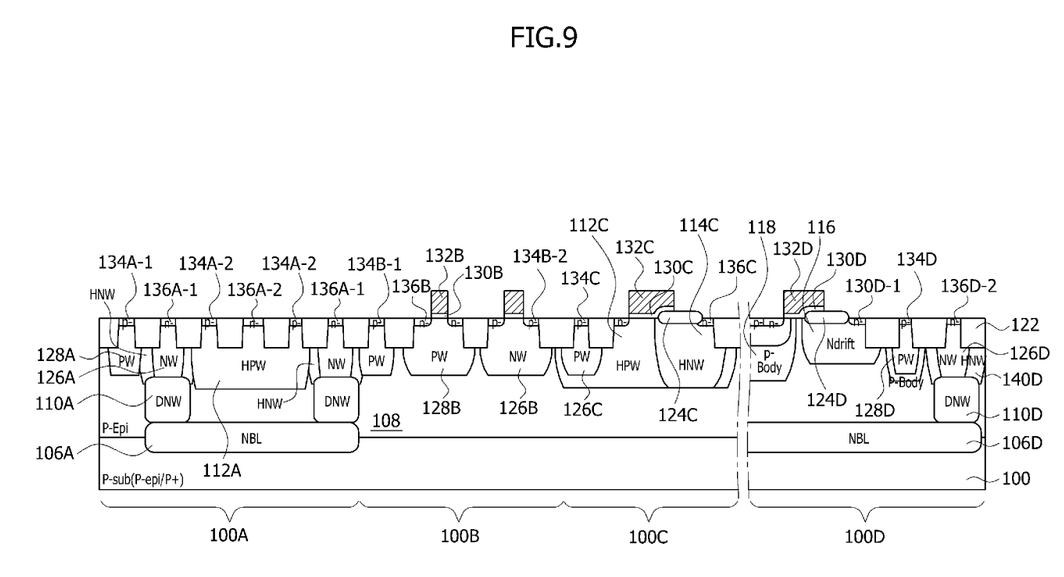

Referring to FIG. 9, the substrate including the n-wells 126A, 126B and 126D and the p-wells 128A, 128B, 128C and 128D may be cleaned to expose active regions between the isolation layers 122 and the field insulation layers 124C and 124D. A gate insulation layer and a gate conductive layer (e.g., a doped polysilicon layer) may be sequentially formed on the cleaned substrate. The gate conductive layer and the gate insulation layer may be patterned using a photolithography process and an etching process, thereby forming gates 130B+132B of the CMOS transistors, a gate 130C+132C of the DENMOS transistor, and a gate 130D+132D of the LDNMOS transistor. The gate 130C+132C of the DENMOS transistor may be formed to overlap with the high voltage p-well 112C and the field insulation layer 124C, and the gate 130D+132D of the LDNMOS transistor may be formed to substantially overlap with the p-type body region 118 and the field insulation layer 124D.

Subsequently, n-type impurity ions and p-type ion impurity ions may be implanted into the active regions using the gates 130B+132B, 130C+132C and 130D+132D as ion implantation masks. As a result, a p-sub pick-up region 134A-

1, a p-type base (B) 134A-2, an n-type emitter (E) 136A-2 and an n-type collector (C) 136A-1 may be formed in the bipolar transistor region 100A, and a p-sub pick-up region 134B-1, a source (S) and a drain (D) 136B of an NMOS transistor, and a source (S) and a drain (D) 134B-2 of an PMOS transistor may be formed in the CMOS transistor region 100B. Further, a p-type bulk pick-up region 134C and source/drain (S, D) 136C of a DENMOS transistor may be formed in the DENMOS transistor region 100C, and source/drain (S, D) 136D-1 of a LDNMOS transistor, a p-type ground pick-up region 134D and an n-type NBL bias region 136D-2 may be formed in the LDNMOS transistor region 100D.

Figure 10:
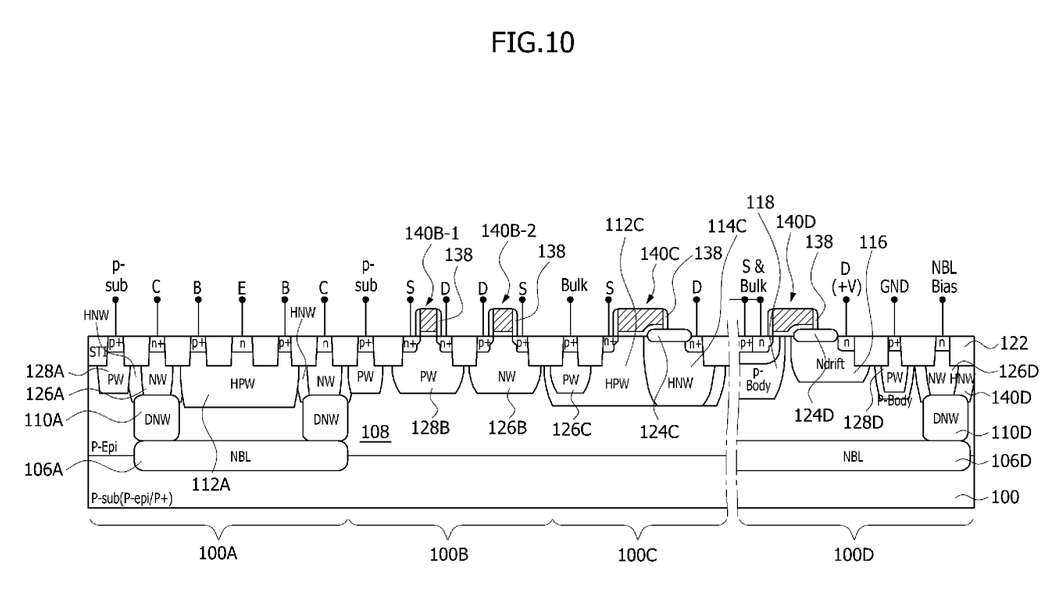

Referring to FIG. 10, the gate insulation pattern 130B and the gate conductive pattern 132B of the NMOS transistor may constitute a gate pattern 140B-1, and the gate insulation pattern 130B and the gate conductive pattern 132B of the PMOS transistor may constitute a gate pattern 140B-2. In addition, the gate insulation pattern 130C and the gate conductive pattern 132C of the DENMOS transistor may constitute a gate pattern 140C, and the gate insulation pattern 130D and the gate conductive pattern 132D of the LDNMOS transistor may constitute a gate pattern 140D. Insulation spacers 138 may be formed on sidewalls of the gate patterns 140B-1, 140B-2, 140C and 140D. N-type impurity ions and p-type impurity ions may be implanted into the corresponding active regions using the gate patterns 140B-1, 140B-2, 140C and 140D as implantation masks, thereby forming heavily doped source/drain regions. In the event that lightly doped source/drain regions are additionally formed prior to formation of the insulation spacers 138, the source/drain regions may be formed to have lightly doped drain (LDD) structures. Subsequently, backend processes for forming contact structures and interconnection lines may be performed to complete a BCD-MOS device.

According to the various embodiments set forth above, isolation layers used in realization of logic circuits may be formed by a trench isolation technique, and field insulation layers used in realization of high power transistors may be formed by a LOCOS technique. Thus, the integration density of the logic circuits can be increased and an on-resistance of high power transistors can be minimized. Further, the field insulation layers may be formed using a thermal oxidation process. Thus, the field insulation layers may have a uniform thickness, and a trap density in the field insulation layers may be minimized. As a result, the high power transistors may exhibit stable electrical characteristics and/or an excellent reliability relating to hot carrier injection (HCI), and pre-cleaning processes can be stably performed in subsequent process steps.

Moreover, a field mask pattern used in formation of the field insulation layers may be formed by additionally patterning a nitride pattern used in formation of the trench isolation layers without removal of the nitride pattern. Thus, a process for forming the field insulation layers can be simplified.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
a semiconductor substrate including a logic region in which a logic device is formed and a high voltage region in which a high power device is formed;
trenches in the semiconductor substrate;
isolation layers in respective ones of the trenches; and
at least one field insulation layer disposed at a surface of the semiconductor substrate in the high voltage region, wherein the at least one field insulation layer is a local oxidation of silicon (LOCOS) layer that includes a first portion extending into the semiconductor substrate and a second portion upwardly protruding from a top surface of the semiconductor substrate;
wherein the first portion of the field insulation layer has a first thickness corresponding to about 40% of a total thickness of the field insulation layer;
wherein the second portion of the field insulation layer has a second thickness corresponding to about 60% of the total thickness of the field insulation layer.

2. The semiconductor device of claim 1, wherein each of the isolation layers includes a high density plasma (HDP) oxide layer, a spin-on-glass (SOG) layer, or a tetra-ethyl-ortho-silicate (TEOS) layer.

3. The semiconductor device of claim 1:
wherein the logic device includes CMOS transistors and a bipolar transistor; and
wherein the high power device includes a drain extension MOS (DEMOS) transistor and a double diffused MOS (DMOS) transistor.

4. The semiconductor device of claim 3:
wherein the at least one field insulation layer is disposed at a surface of a drift region of a first conductivity type formed in the semiconductor substrate; and
wherein the DMOS transistor includes:
a body region of a second conductivity type disposed in the semiconductor substrate to be spaced apart from the drift region;
a source of the first conductivity type disposed in the body region;
a drain of the first conductivity type disposed in the drift region to be adjacent to an end of the field insulation layer; and
a gate pattern disposed to overlap with the body region and to extend onto the first field insulation layer.

5. The semiconductor device of claim 4, wherein the body region is a p-type body region.

6. The semiconductor device of claim 3:
wherein the at least one field insulation layer is disposed at a surface of a first well of a first conductivity type formed in the semiconductor substrate; and
wherein the DEMOS transistor includes:
a second well of a second conductivity type disposed in the semiconductor substrate to surround sidewalls of the first well;
a gate pattern disposed to overlap with the second well and to extend onto the field insulation layer;
a source disposed in the second well to be adjacent to an end of the gate pattern; and
a drain disposed in the first well to be adjacent to an end of the field insulation layer opposite to the source.

7. A method of manufacturing a semiconductor device, the method comprising:
forming a trench isolation mask on a semiconductor substrate including a logic region in which a logic device is formed and a high voltage region in which a high power device is formed;
forming trench isolation layers in the semiconductor substrate exposed by the trench isolation mask;
patterning the trench isolation mask to form a field mask pattern exposing at least one portion of the semiconductor substrate;
annealing and oxidizing the substrate including the field mask pattern to densify the isolation layers and to form at least one field insulation layer of the high power device at a surface of the exposed semiconductor substrate;

removing the field mask pattern;

forming first wells of a first conductivity type and second wells of a second conductivity type in the semiconductor substrate; and forming gate patterns of the logic device and the high power device on the substrate including the first wells and the second wells.

8. The method of claim 7, wherein the trench isolation layers include a high density plasma (HDP) oxide layer, a spin-on-glass (SOG) layer, or a tetra-ethyl-ortho-silicate (TEOS) layer.

9. The method of claim 7, wherein forming the trench isolation mask includes:

forming a pad oxide layer on the semiconductor substrate;

forming a nitride layer on the pad oxide layer; and patterning the nitride layer and the pad oxide layer to expose portions of the semiconductor substrate.

10. The method of claim 7, wherein forming the trench isolation layers includes:

etching the semiconductor substrate using the trench isolation mask as an etch mask to form trenches;

forming an insulation layer on the trench isolation mask and in the trenches; and planarizing the insulation layer.

11. The method of claim 10, wherein the insulation layer is planarized using a chemical mechanical polishing (CMP) process, and the trench isolation mask remains to have a thickness of about 700 Å to about 800Å after planarization of the insulation layer.

12. The method of claim 7, wherein annealing and oxidizing the substrate is performed in an ambient gas including an oxygen gas and a nitrogen gas.

13. The method of claim 7, wherein annealing and oxidizing the substrate includes:

annealing the substrate in a nitrogen gas; and oxidizing the annealed substrate in an oxygen gas.

14. The method of claim 13, wherein annealing and oxidizing the substrate is performed at about 800° C. to about 1000° C. for a duration of about 30 minutes to about 90 minutes.

\* \* \* \* \*